United States Patent [19]
Fontana, Jr. et al.

[11] Patent Number: 5,503,870
[45] Date of Patent: Apr. 2, 1996

[54] METHOD FOR PRODUCING THIN FILM MAGNETIC STRUCTURE

[75] Inventors: Robert E. Fontana, Jr., San Jose; Frances A. Houle, Fremont; Ching H. Tsang, Sunnyvale, all of Calif.

[73] Assignee: International Business Machines Corporation, Armonk, N.Y.

[21] Appl. No.: 361,018

[22] Filed: Dec. 21, 1994

Related U.S. Application Data

[63] Continuation of Ser. No. 148,014, Nov. 4, 1993, abandoned, which is a continuation of Ser. No. 908,820, Jul. 2, 1992, abandoned, which is a continuation of Ser. No. 475,611, Feb. 6, 1990, abandoned.

[51] Int. Cl.$^6$ .................... B05D 3/06; B05D 5/12
[52] U.S. Cl. ............ 427/130; 427/131; 427/132; 427/555; 427/556; 427/559
[58] Field of Search .................. 427/130, 131, 427/132, 554, 555, 556, 552, 557, 558, 559

[56] References Cited

U.S. PATENT DOCUMENTS

| | | | |
|---|---|---|---|
| 3,197,334 | 7/1965 | Wade, Jr. | 427/130 |
| 3,314,056 | 4/1967 | Lawrance | 340/174.1 |
| 3,667,100 | 6/1972 | Marchal et al. | 427/132 |
| 3,676,867 | 7/1972 | Bacon et al. | 427/128 |
| 3,840,898 | 10/1974 | Bajorek et al. | 360/113 |
| 3,887,944 | 6/1975 | Bajorek et al. | 360/113 |
| 3,900,593 | 8/1975 | Herczog et al. | 427/56.1 |
| 4,043,877 | 8/1977 | Littwin | 204/15 |
| 4,236,946 | 12/1980 | Aboaf et al. | 204/192.22 |
| 4,265,684 | 5/1981 | Boll | 148/121 |
| 4,268,584 | 5/1981 | Ahn et al. | 428/620 |
| 4,451,500 | 5/1984 | Gerard et al. | 427/53.1 |
| 4,533,582 | 8/1985 | De Palma et al. | 427/131 |
| 4,664,941 | 5/1987 | Washburn | 427/53.1 |
| 4,684,547 | 8/1987 | DiStefano et al. | 427/132 |
| 4,772,976 | 9/1988 | Otomo et al. | 360/125 |
| 4,809,109 | 2/1989 | Howard et al. | 427/131 |
| 4,897,288 | 1/1990 | Jenson | 427/132 |
| 4,925,700 | 5/1990 | Brezoczky et al. | 427/130 |
| 4,940,511 | 7/1990 | Fontana, Jr. et al. | 427/131 |
| 4,959,243 | 9/1990 | Steininger et al. | 427/132 |
| 4,994,320 | 2/1991 | Jagielinski | 427/132 |
| 5,062,196 | 11/1991 | Deroux-Dauphin | 427/131 |
| 5,100,692 | 3/1992 | Nakamura et al. | 427/53.1 |
| 5,169,504 | 12/1992 | Bechevet et al. | 427/130 |
| 5,252,367 | 10/1993 | Sato et al. | 427/132 |

OTHER PUBLICATIONS

R. P. McGouey, Fabrication of Magnetic Bubble Devices, Aug. 1978, IBM Technical Disclosure Bulletin, vol. 21, No. 3.

L. Schultz et al., "Permanent Local Modification of the Magnetic Bubble Properties of Epitaxial Garnet Films by Laser Annealing", Journal of Applied Physics, vol. 50, No. 9, Sep. 1979, pp. 5902–5905.

Primary Examiner—Marianne Padgett
Attorney, Agent, or Firm—Leslie G. Murray

[57] ABSTRACT

A method for producing a magnetic structure, such as a thin film magnetic head, in which the magnetic and electrical characteristics of magnetic material are tailored to produce magnetic and electrical characteristics in selected localized areas of the magnetic material. In a specific embodiment, the structure comprises a layer of magnetic material having an overlayer and an underlayer, and the magnetic characteristics of the material are modified by rapid thermal annealing.

16 Claims, 4 Drawing Sheets

METHOD FOR PRODUCING THIN FILM MAGNETIC STRUCTURE

This is a continuing application of application Ser. No. 08/148,014 filed on Nov. 4, 1993 now abandoned, which is a continuation of Ser. No. 07/908,820 filed Jul. 2, 1992, now abandoned, which is a continuation of application Ser. No. 07/475,611 filed on Feb. 6, 1990 and now abandoned.

FIELD OF THE INVENTION

This invention relates to a method for producing thin film magnetic structures and, more particularly, to a method for locally modifying the magnetic characteristics of the thin film magnetic structure.

BACKGROUND AND PRIOR ART

There are prior art techniques for local modification of magnetic material in the fabrication of magnetic devices. Lawrance, U.S. Pat. No. 3,314,056, "Gapless Magnetic Head", issued Apr. 11, 1967, discloses a magnetic head having a ring core in which the gap is formed by treatment to reduce the permeability in a restricted core region. Neutron bombardment is the preferred method to significantly diminish the magnetic properties in the gap region. The impact of the neutrons serves to strain the existing crystal structure of the localized region so that the magnetic properties of the core material in the treated region are affected.

Boll, U.S. Pat. No. 4,265,684, "Magnetic Core Comprised of Low-retentivity Amorphous Alloy", issued May 5, 1981, discloses a magnetic head having a ring core made from an amorphous alloy. An effective gap is produced in the core by converting the material in a local region to the crystalline state by localized heating to a temperature above the crystallization temperature of about 400° C.

Otomo et al., U.S. Pat. No. 4,772,976, "Process for Preparing Magnetic Layer and Magnetic Head Prepared Using the Same", issued Sep. 20, 1988, describe a thin film magnetic head in which ion implantation is used to locally vary the magnetic characteristics of the magnetic material. The ions are then thermally diffused into the material by heat treatment to attain uniform magnetic characteristics.

L. Schultz et al., "Permanent Local Modification of the Magnetic Bubble Properties of Epitaxial Garnet Films By Laser Annealing," Journal of Applied Physics, Vol. 50, No. 9, September 1979, describe laser annealing of magnetic materials. These studies were aimed toward using a laser to locally increase the magnetization of garnet films for channeling of magnetic bubbles. The changes in magnetic properties that were observed were attributed to a crystallographic site redistribution of the Ga and Fe atoms in annealed regions which support mobile bubbles.

None of the cited references shows a magnetic structure comprising a layer of magnetic material with an overlayer and an underlayer and heat treatment to produce interaction between the materials of the overlayer and the underlayer with the layer of magnetic material to produce selected magnetic and electrical characteristics in localized areas of the layer of magnetic material. However, there is prior art which deals with the local modification of a magnetic structure with an overlayer.

Bajorek et al., U.S. Pat. No. 3,840,898, "Self-biased Magnetoresistive Sensor", issued Oct. 8, 1974, describe a magnetoresistive sensor in which a protective coating of photoresist is deposited over a preselected portion of an NiFe film, and the structure is then annealed at elevated temperatures in an oxygen-rich atmosphere. The resultant oxidation of the unprotected part of the NiFe film results in depletion of Fe from the bulk of the unprotected part of the film so as to effectively change its composition, and also change its composition-dependent magnetic characteristics.

Bajorek et al., U.S. Pat. No. 3,887,944, "Method for Eliminating Part of Magnetic Crosstalk in Magnetoresistive Sensors", issued Jun. 3, 1975, disclose an integrated array of side-by-side magnetoresistive (MR) reading heads. To eliminate crosstalk between adjacent MR read heads, a region of high-coercivity material is formed between adjacent MR read heads. The region of high-coercivity material can be produced by exchange coupling through alloying or other chemical reaction, or by chemical treatment, to roughen the MR stripe prior to depositing a conductor into the roughened area.

However, Bajorek et al., in the above two patents, do not teach a purposeful selection of an underlayer as well as an overlayer in producing modification of their magnetic structure. Also, they do not consider the possibility of producing bias fields, the direction of such bias fields, if they do exist, or the subsequent domain states of the MR sensor.

SUMMARY OF THE INVENTION

It is therefore the principal object of this invention to provide a method for producing a magnetic structure in which the electrical and magnetic characteristics of the magnetic structure can be locally modified.

According to the invention, the method comprises the steps of forming a layered structure comprising an underlayer, a layer of magnetic material, and an overlayer, and supplying thermal energy to the magnetic structure in an amount sufficient to provide selective interaction between the materials of the overlayer and the underlayer with the layer of magnetic material to produce predetermined magnetic and electrical characteristics in the layer of magnetic material.

In a specific embodiment, the step of supplying thermal energy is produced by local heating, thereby producing predetermined magnetic and electrical characteristics in selected local areas of the layer of magnetic material.

In another specific embodiment, the step of supplying thermal energy is produced by rapid thermal anneal.

In further specific embodiments, either the underlayer and/or the overlayer are patterned to produce a plurality of separate regions, each having different characteristics.

For a fuller understanding of the nature and advantages of the present invention, reference should be made to the following detailed description taken in conjunction with the accompanying drawings.

DESCRIPTION OF THE PREFERRED EMBODIMENT

Figure 1A:
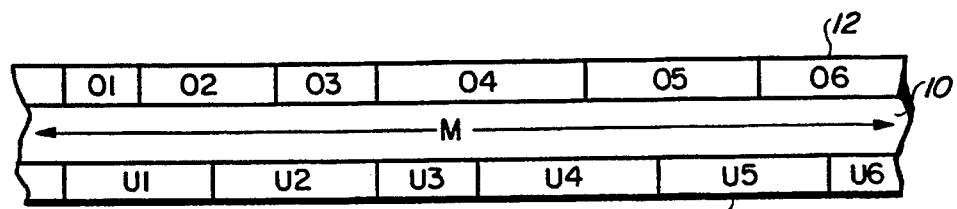
FIGS. 1A–1B are sketches illustrating the general principles of the present invention.
Figure 1B:
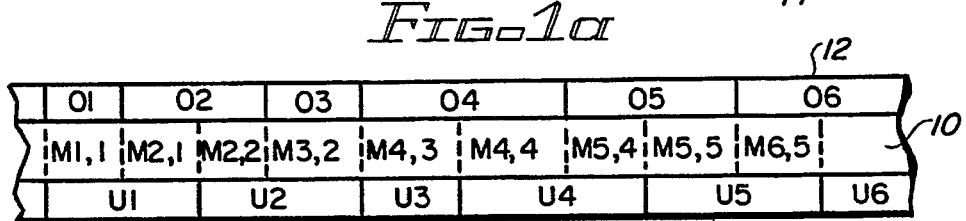

The general principles of the invention are illustrated in FIGS. 1A–1B in which a structure is shown (FIG. 1A) comprising a thin film layer of magnetic material 10, a thin film overlayer 12 having various regions O1 to O6, and a thin film underlayer 14 having various regions U1 to U6. The layered structure is subjected to a thermal treatment, which will be described in detail later, and the resultant structure (FIG. 1B) comprises a layer of magnetic material 10 with localized magnetic film regions Mx,y after thermal treatment. In some cases, it may be chosen to have one or more regions of the overlayer missing when this will permit the achievement of the desired magnetic properties for the magnetic structure. The figures show a two-dimensional representation of a three-dimensional structure.

Figure 2:
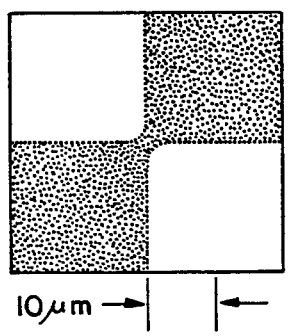
FIG. 2 is a Kerr scan of high-coercivity regions (dark) and low-coercivity regions (light) produced by the method illustrated in FIG. 1.

In a specific example in which the thin film layer of magnetic material was a layer of $Ni_{80}Fe_{20}$ about 300 Å thick on a glass underlayer, a "checkerboard" pattern was formed using a tantalum overlayer alternating with regions of no overlayer to produce regions of the structure having a high permeability alternating with regions in which the permeability was suppressed due to high coercivity. The Kerr plot of FIG. 2, a magneto-optical map of magnetic activity, shows that localized changes were made in the magnetic structure. In this plot, the light-colored regions show high-magnetic activity due to high permeability, and the dark regions show low-magnetic activity due to low permeability.

TABLE

| Magnetic Structure | Initial Coercivity (Oe) | Final Coercivity (Oe) | |
|---|---|---|---|
| Ta Overlayer on NiFe on Glass Underlayer | 1.6 | 1.8 | (3A) |
| Ta Overlayer on NiFe on Ta Underlayer | 2.5 | 2.7 | (3B) |

TABLE-continued

| Magnetic Structure | Initial Coercivity (Oe) | Final Coercivity (Oe) | |
|---|---|---|---|
| NiFe on Glass Underlayer | 2.5 | 40 | (4A) |
| NiFe on Ta Underlayer | 2.5 | 85 | (4B) |

The table shows the effects of heat treatment in air at 400° C. for 50 seconds on a 300 Å thick NiFe film with various underlayer and overlayer configurations. The overlayers are either 200 Å film of tantalum or no overlayer, and the underlayer is either 200 Å film of tantalum or glass.

Figure 3A:
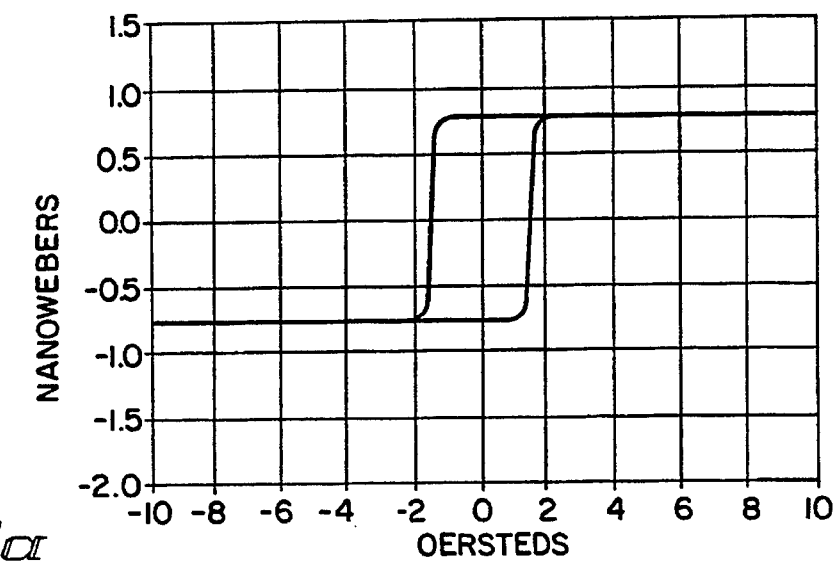
FIG. 3A is a plot of a B-H loop for a soft magnetic structure comprising a tantalum overlayer, an NiFe layer, and a glass underlayer after heat treatment.
Figure 3B:
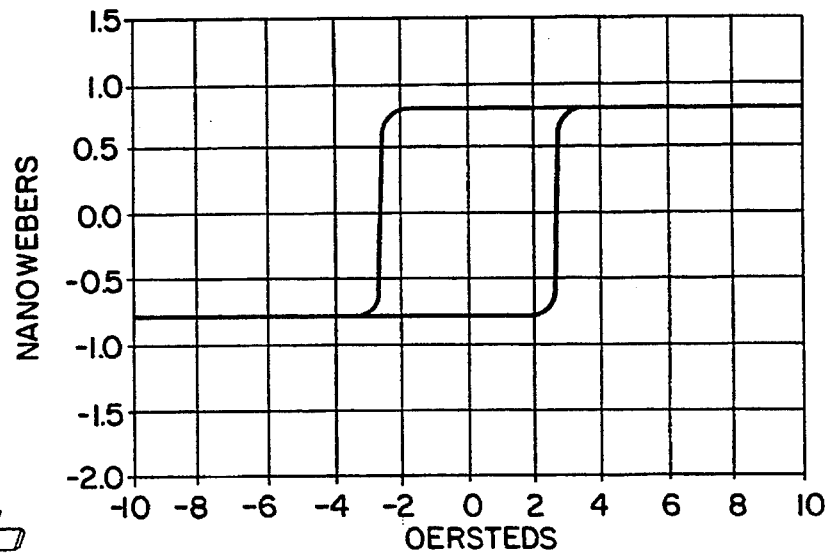
FIG. 3B is a plot of a B-H loop for a soft magnetic structure comprising a tantalum overlayer, an NiFe layer, and a tantalum underlayer after heat treatment.
Figure 4A:
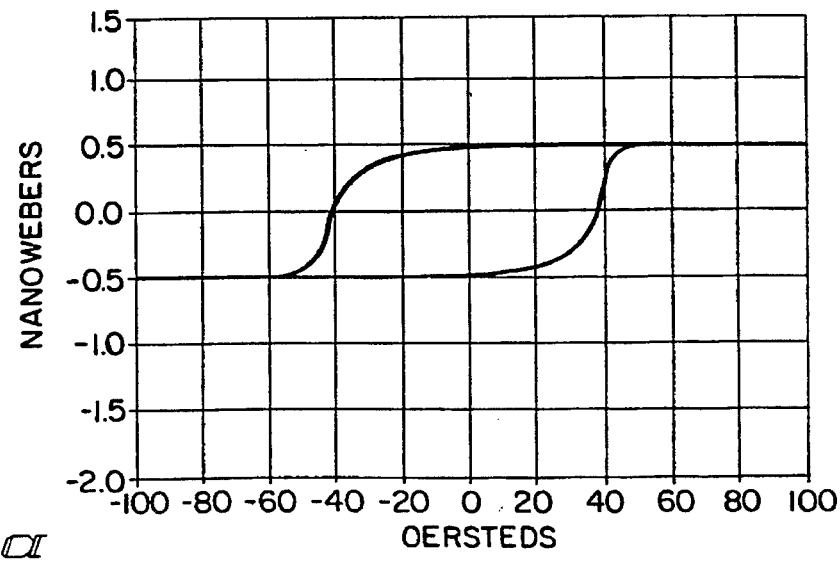
FIG. 4A is a plot of a B-H loop for the soft magnetic structure comprising an NiFe layer having no overlayer and a glass underlayer after heat treatment.
Figure 4B:
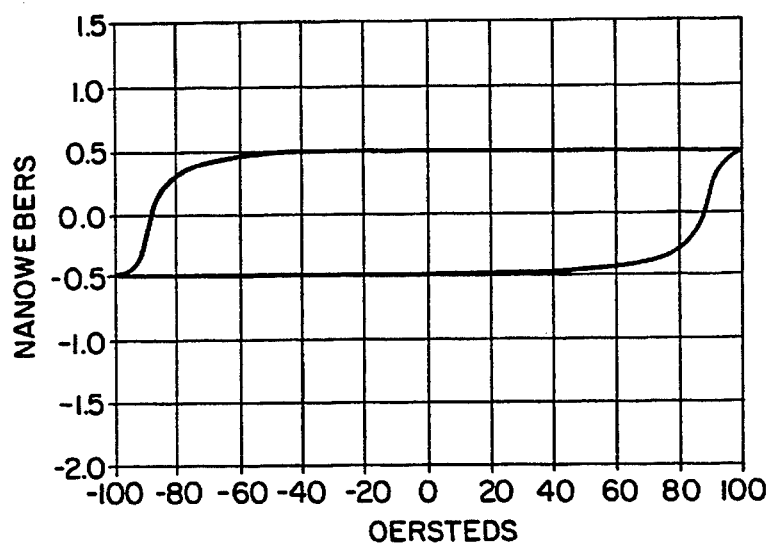
FIG. 4B is a plot of a B-H loop for a soft magnetic structure comprising an NiFe layer having no overlayer and a tantalum underlayer after heat treatment.

From the table, it can be observed that the NiFe film has very low coercivity before heat treatment in all cases. When the tantalum overlayer is present, the NiFe film remains soft after heat treatment regardless of the choice of underlayer as shown in FIGS. 3A–3B. When the tantalum overlayer is absent, a large increase in coercivity of the NiFe film is observed after heat treatment. In this case, the choice of underlayer is important to determine the amount of coercivity change. For example, when a glass underlayer is used, a final coercivity of 40 oersteds is obtained (FIG. 4A), whereas when a tantalum underlayer is used, a larger coercivity of 85 oersteds (FIG. 4B) is obtained which is more than double the coercivity obtained with a glass underlayer.

Figure 9A:
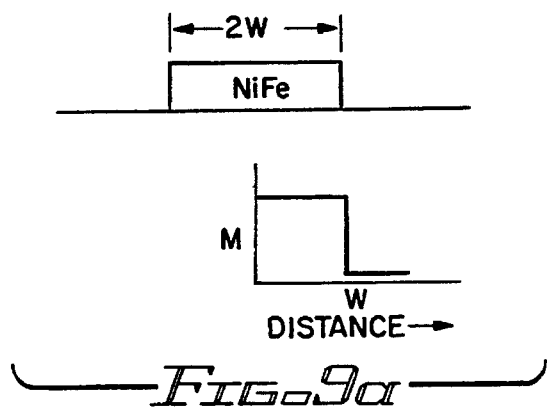
FIGS. 9A–9B are sketches showing magnetization M versus distance for a prior art structure and for a specific embodiment of the invention.
Figure 11A:
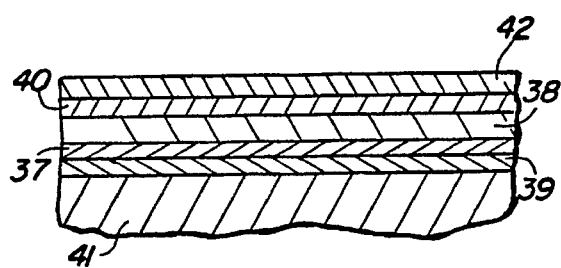
FIGS. 11A, 11B, 11C and 11D are sketches showing the method steps for an alternate embodiment of the method for making an MR sensor according to the present invention.
Figure 9B:
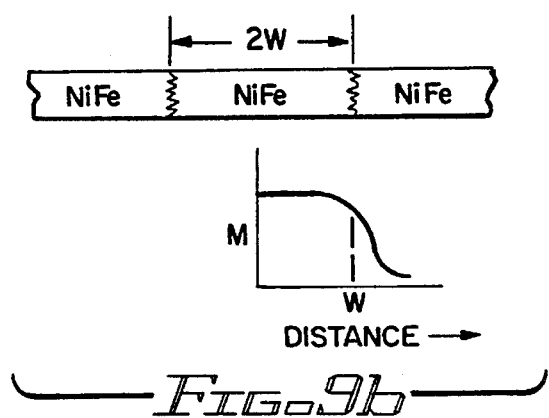
Figure 11B:
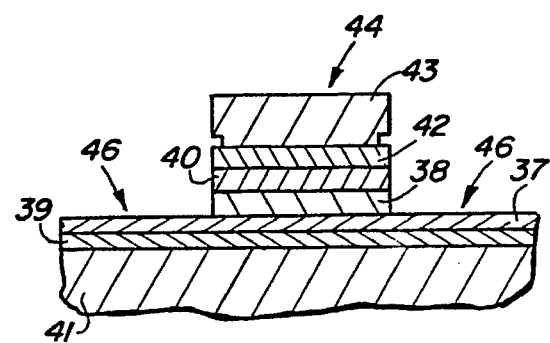

The thermal treatment to which the magnetic structure is subjected may be produced by any suitable technique in which a controlled temperature can be maintained for a chosen time. One way in which the thermal treatment can be produced is by laser heating by a suitable pulsed or continuous laser. The desired heating can be produced by the appropriate choice of power level, pulse length, laser beam spot size, scan rate, and duration of the treatment. Also, in contrast to prior art techniques in which junctions between regions having different magnetic properties are abrupt (FIG. 9A), a nonuniform temperature profile in laser heating provides the option of having regions of "graded" magnetic or electrical properties (FIG. 9B).

Figure 5:
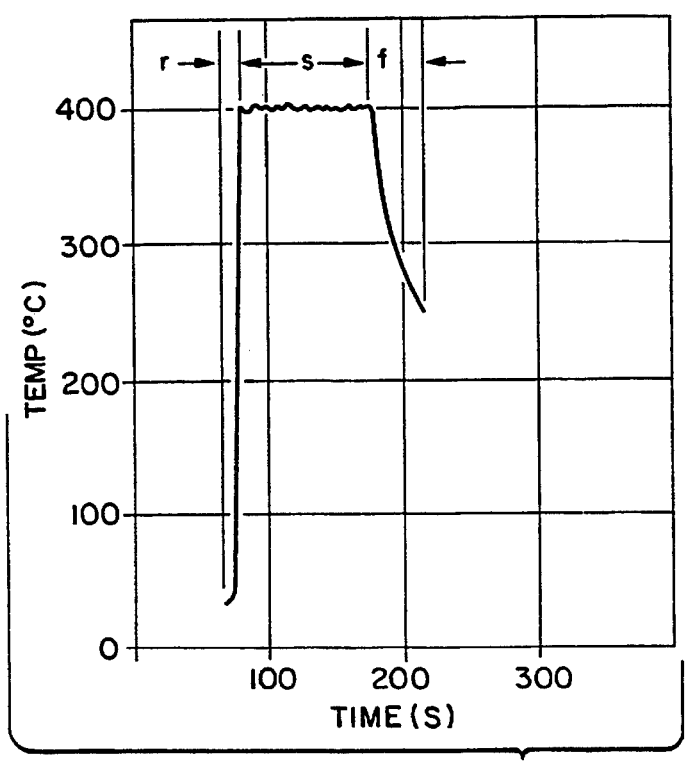
FIG. 5 is a plot of temperature T versus time t for a typical rapid thermal anneal.

Another thermal treatment is commonly referred to as rapid thermal anneal where the whole substrate is heated for a selected time within the typical range of one second to several hundred seconds to a selected temperature. FIG. 5 shows a temperature profile for thermal treatment by rapid thermal anneal. The temperature is rapidly increased from ambient temperature to the selected anneal temperature in a time r, held at the selected anneal temperature for a time s, and then returned to a reduced temperature in a time f. More complex time-temperature profiles can also be used in which the temperature is varied in steps among several values for selected periods of time. Rapid thermal anneal is a preferred thermal treatment due to the precision which can be achieved in temperatures and times for the thermal treatment.

A further method for carrying out the thermal treatment comprises a standard oven for annealing for times longer than several minutes.

The layer of magnetic material 10 (FIG. 1) may comprise any suitable layer of materials such as NiFe, NiFe alloys, and Ni, for example. Although the term "layer" is used, the layer of magnetic material could be formed of multiple sublayers either of different magnetic materials, or of one or more magnetic materials separated by nonmagnetic spacer layers. In general, the magnetic material may even have spatially inhomogeneous properties, in which case the effect of heat treatment would be to produce additional modification of local properties according to the presence of the particular overlayer and underlayer at each location in the magnetic layer.

The materials for the overlayer 12 and underlayer 14 (FIG. 1) can be chosen for producing a desired change which may include no change in some regions. The desired changes may comprise changes to magnetization $M_s$, coercivity $H_c$, anisotropy $H_k$, magnetostriction $\lambda$, magnetoresistance $\Delta R$, or resistivity $\rho$, either alone or in combination with another. In general, it is possible to pattern the overlayer as well as the underlayer to produce different electrical and magnetic characteristics in each region.

In regions in which no change in the electrical and magnetic characteristics is desired, the refractory materials as a class can be used for overlayer 12 and underlayer 14, and specific materials comprise $Al_2O_3$, $SiO_2$, tantalum (Ta), molybdenum (Mo), and tungsten (W). In those cases in which it is desired to change the electrical and magnetic characteristics, the following materials are suitable for use as either underlayer or overlayer with a magnetic film comprising NiFe: titanium (Ti), copper (Cu), manganese (Mn), chromium (Cr), rhodium (Rh), and manganese iron (MnFe). However, the role assumed by a certain selected material is in general different depending on whether the material is used as an overlayer or an underlayer, and the change produced in the magnetic layer depends on the selection of both underlayer and overlayer. A wide variety of magnetic materials can be used, and the above and other materials can be used with those materials. In a particular case, no overlayer is used and the magnetic material is allowed to interact directly with the fluid environment and the underlayer during thermal treatment. In another particular case, the substrate material can be chosen to be the underlayer material to achieve a desired change.

The other variable which can affect the results of the thermal treatment relates to the fluid environment of the structure during the thermal treatment. The fluid can be a gas, a liquid, or a vacuum, and the fluid environment can be chosen to be reactive or inert to the magnetic structure. For example, should it be desired to produce oxidation of components of the structure, an oxygen-containing atmosphere may be used.

Figure 6A:
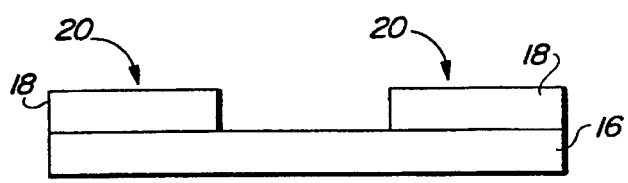
FIG. 6A is a sketch showing an end view of a prior art magnetoresistive (MR) sensor.
Figure 6B:
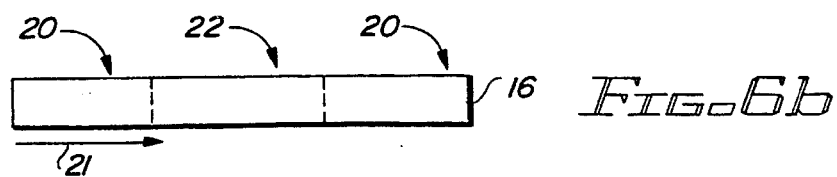
FIG. 6B is a sketch showing the end view of an MR sensor made according to the present invention.
Figure 7:
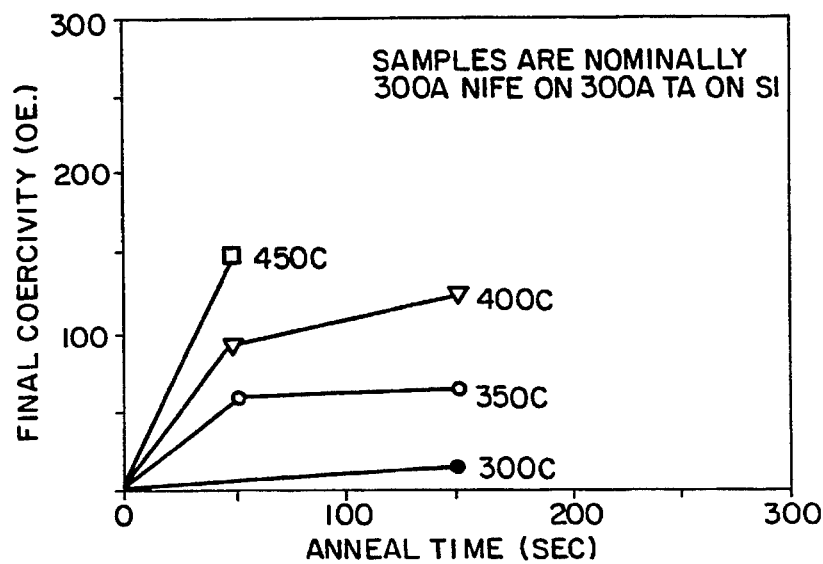
FIG. 7 is a plot of a family of curves of coercivity versus anneal time t for several anneal temperatures.
Figure 8:
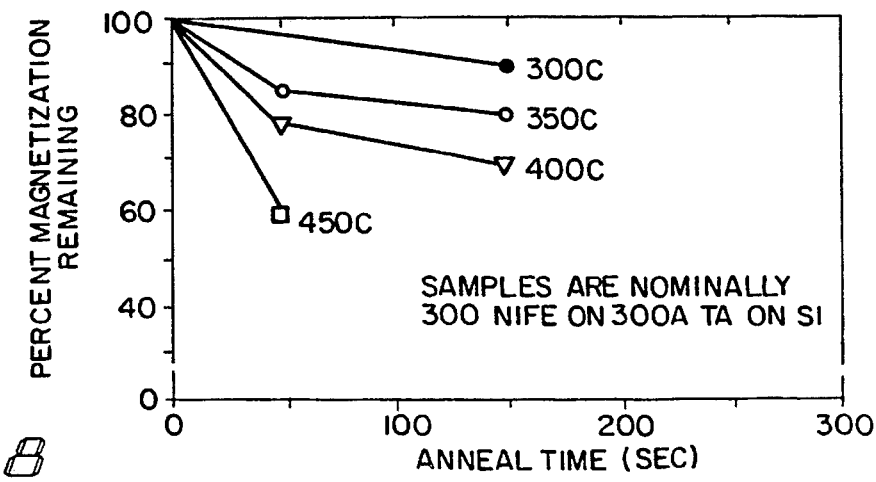
FIG. 8 is a plot of a family of curves of percent magnetization remaining versus anneal time t for several anneal temperatures.

An application of this invention to the production of a magnetoresistive (MR) sensor is shown in FIG. 6. FIG. 6A shows the magnetic layers of a prior art MR sensor which comprises an MR layer 16 upon which is deposited a hard magnetic bias layer 18 in each of the end regions 20 of the sensor to produce high coercivity in the end regions of the MR sensor. FIG. 6B shows the magnetic layers of a similar MR sensor produced according to the present invention. In this case, the MR layer 16 is modified to produce a hard magnetic state in the end regions 20, and to leave a soft magnetic material in the central region 22. Examples of changes in coercivity that can be achieved by the thermal treatment are shown in FIG. 7. This curve was derived for NiFe as the material for MR layer 16, and similar curves can be derived for other magnetic materials. FIG. 8 shows the magnetization remaining versus anneal time for the same material. The magnetization of the high-coercivity end regions is then aligned along the longitudinal direction (FIG. 6B), as defined by arrow 21, by the application of an external longitudinal magnetic field. This magnetic structure permits the MR sensor to be maintained in a single-domain state due to continuity of the longitudinal magnetic flux between the central region and the end regions. In general, the central region of the MR sensor is biased to achieve linearity in the MR response, and this bias can be produced by either soft film biasing or shunt biasing, for example.

Figure 10A:
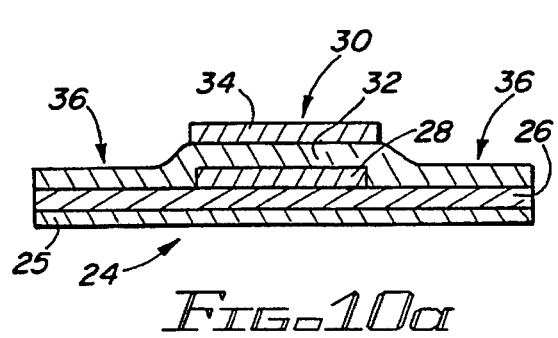
FIGS. 10A–10B are sketches showing the method steps for a specific embodiment of the method for making an MR sensor according to the present invention.
Figure 11C:
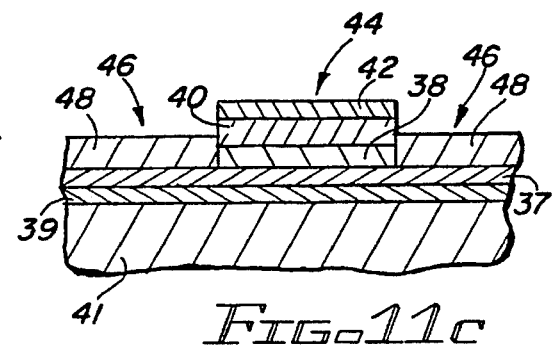
Figure 10B:
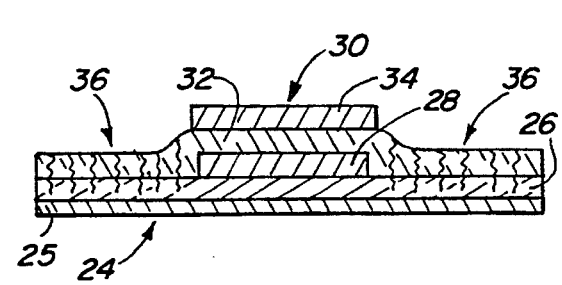
Figure 11D:
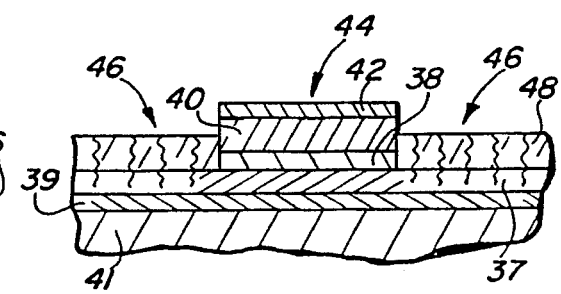

The process for fabricating a specific embodiment of an MR sensor will be described with reference to FIG. 10. The MR sensor comprises a soft magnetic bias layer 26 such as NiFeRh which is deposited on a suitable underlayer 25 such as tantalum, for example, provided on substrate 24. A spacer layer 28 is deposited and patterned to cover the central active region 30 of the MR sensor. The MR layer 32 such as NiFe, for example, is then deposited over the length of the sensor. An overlayer 34 of tantalum, for example, is deposited and patterned to cover substantially only the central region of the MR sensor (FIG. 10A). The entire structure is then subjected to a rapid thermal anneal (FIG. 10B), thereby altering the magnetic properties of the end regions 36 of the MR sensor to produce a high coercivity in the end regions 36. The magnetization of the end regions 36 is then aligned by the application of a large, external, longitudinal magnetic field to provide longitudinal flux continuity between the end regions and the central region of the MR sensor. On the other hand, both the soft magnetic bias layer 26 and the MR layer 32 retain their soft magnetic properties in the central active region 30 of the MR sensor.

An alternate embodiment of a process for producing an MR sensor according to the present invention is described in conjunction with FIG. 11. An MR layer 37 is produced on an underlayer 39 and a suitable substrate 41, followed by a spacer layer 38, a soft magnetic bias layer 40, and an overlayer (FIG. 11A). The magnetic structure is covered with a resist layer 43, and the resist layer 43 is patterned to cover only the central region 44 of the MR sensor. The overlayer 42, the soft film 40, and the spacer layer 38 are removed in the end regions 46 of the MR sensor (FIG. 11B). A soft magnetic layer 48 is then deposited in the end regions to match the magnetic moments in the central and end regions of the MR sensor. The resist is then removed (FIG. 11C). The entire structure is then subjected to a rapid thermal anneal (FIG. 11D), thereby altering the magnetic condition of the end regions 46 to a high-coercivity region to provide a hard magnetic longitudinal bias for the MR sensor. The magnetization of the high-coercivity end regions 46 is then aligned along the longitudinal direction by the application of an external, longitudinal magnetic field.

A key feature of this invention is the purposeful choice of underlayer material to achieve the desired modification of properties. In the preferred embodiments, a tantalum underlayer was selected to provide a sufficiently high coercivity after heat treatment for proper operation of the MR sensor. In contrast, should a glass underlayer be selected, the coercivity would be only half as great. An additional feature of the preferred embodiments is the deliberate alignment of the magnetization of the end regions of the MR sensor along the longitudinal direction so as to provide longitudinal flux continuity between the end regions and the central region of the MR sensor to provide single-domain operation of the central region. Another feature of the preferred embodiments is the fabrication of the MR sensor by converting a continuous layer of magnetic material into a soft magnetic region at the center and a hard magnetic region in the end regions, thereby eliminating contiguous junctions between regions of dissimilar materials.

While the preferred embodiments of the present invention have been illustrated in detail, it should be apparent that modifications and adaptations to those embodiments may occur to one skilled in the art without departing from the scope of the present invention as set forth in the following claims.

Having thus described our invention, what we claim as new and desire to secure by Letters Patent is:

1. A method of fabricating a magnetoresistive sensor, said magnetoresistive sensor having end regions separated by a central active region comprising the steps of:

depositing an underlayer of tantalum over a substrate;

depositing a magnetic bias layer over said tantalum underlayer;

forming a nonmagnetic spacer layer over said bias layer in said central active region only;

depositing a magnetoresistive layer over said spacer layer and said bias layer, said magnetoresistive layer being of a material selected from the group consisting of nickel, nickel-iron and alloys of nickel-iron, said magnetoresistive layer separated from said bias layer by said spacer layer in said central active region and in contact with said bias layer in said end regions;

forming an overlayer of tantalum over said magnetoresistive layer in said central active region only; and annealing said magnetoresistive sensor for providing an increased value of coercivity in said end regions only of said magnetoresistive sensor.

2. The method of claim 1 wherein the step of annealing is performed at a temperature greater than 300 degrees C.

3. The method of claim 2 wherein said temperature is in the range of 300 degrees C. to 450 degrees C.

4. The method of claim 1 wherein the step of annealing is performed for a time period of less than 300 seconds, 5. The method of claim 1 wherein the step of annealing comprises a rapid thermal anneal process wherein said magnetoresistive sensor is annealed at about 400° C. for about 100 seconds.

6. The method of claim 1 wherein said magnetic bias layer is formed of nickel-iron-rhodium alloy.

7. The method of claim 1 including, after said step of annealing said layered magnetic structure, the additional step of aligning longitudinally a magnetization of said end regions of said magnetoresistive layer is performed.

8. The method of claim 1 wherein said spacer layer comprises tantalum.

9. A method of fabricating a magnetoresistive sensor, said magnetoresistive sensor having end regions separated by a central active region comprising the steps of:

depositing an underlayer of tantalum over a substrate;

depositing a magnetic bias layer formed of nickel-iron-rhodium alloy over said tantalum underlayer;

forming a nonmagnetic spacer layer over said bias layer in said central active region only;

depositing a magnetoresistive layer over said spacer layer and said bias layer, said magnetoresistive layer separated from said bias layer by said spacer layer in said central active region and in contact with said bias layer in said end regions;

forming an overlayer of tantalum over said magnetoresistive layer in said central active region only; and annealing said magnetoresistive sensor for providing an increased value of coercivity in said end regions only of said magnetoresistive sensor.

10. The method of claim 9 wherein the step of annealing is performed at a temperature greater than 300 degrees C.

11. The method of claim 10 wherein said temperature is in the range of 300 degrees C. to 450 degrees C.

12. The method of claim 9 wherein the step of annealing is performed for a time period of less than 300 seconds.

13. The method of claim 9 wherein the step of annealing comprises a rapid thermal anneal process wherein said magnetoresistive sensor is annealed at about 400 degrees C. for about 100 seconds.

14. The method of claim 9 including, after said step of annealing said layered magnetic structure, the additional step of aligning longitudinally a magnetization of said end regions of said magnetoresistive layers is performed.

15. The method of claim 9 wherein said magnetoresistive layer is of a material selected from the group consisting of nickel, nickel-iron and alloys of nickel-iron.

16. The method of claim 9 wherein said spacer layer comprises tantalum.

* * * * *